(12) United States Patent
Alers

(10) Patent No.: US 6,303,426 B1
(45) Date of Patent: Oct. 16, 2001

(54) METHOD OF FORMING A CAPACITOR HAVING A TUNGSTEN BOTTOM ELECTRODE IN A SEMICONDUCTOR WAFER

(75) Inventor: Glenn B. Alers, Santa Cruz, CA (US)

(73) Assignee: Agere Systems Guardian Corp., Berkeley Heights, NJ (US)

( * ) Notice: Subject to any disclaimer, the term of this patent is extended or adjusted under 35 U.S.C. 154(b) by 0 days.

(21) Appl. No.: 09/478,725

(22) Filed: Jan. 6, 2000

(51) Int. Cl.[7] .................................................. H01L 21/8242
(52) U.S. Cl. ............................................. 438/240; 438/654
(58) Field of Search ................................ 438/3, 240, 253, 438/256, 396, 399, 654

(56) References Cited

U.S. PATENT DOCUMENTS

| 5,773,314 | * | 6/1998 | Jiang et al. | 438/240 |
| 5,930,639 | * | 7/1999 | Schuele et al. | 438/240 |
| 6,190,994 | * | 2/2001 | Seo | 438/253 |

* cited by examiner

Primary Examiner—Chandra Chaudhari
(74) Attorney, Agent, or Firm—Stroock & Stroock & Lavan LLP

(57) ABSTRACT

A method of forming a capacitor having a tungsten bottom electrode in a semiconductor wafer that eliminates the effects of oxidation of the surface of the bottom electrode on capacitor performance.

12 Claims, 1 Drawing Sheet

METHOD OF FORMING A CAPACITOR HAVING A TUNGSTEN BOTTOM ELECTRODE IN A SEMICONDUCTOR WAFER

FIELD OF THE INVENTION

The present invention is directed to a capacitor formed in a semiconductor wafer and, more particularly, to a method of forming a capacitor in a semiconductor wafer by nitridizing a tungsten plug which forms the capacitor bottom electrode prior to forming the capacitor dielectric and capacitor top electrode.

BACKGROUND OF INVENTION

In forming a capacitor having a tungsten bottom electrode, chemical vapor deposition (CVD) is typically used to deposit a metal oxide film such as tantalum oxide or titanium oxide to form the capacitor dielectric over the bottom electrode. However, in forming the bottom electrode, a seed material such as titanium nitride is used to grow the tungsten bottom electrode and consequently, that seed material forms a thin layer on the outer surface of the formed tungsten bottom electrode. That thin layer will react with the metal oxide during the formation of the capacitor dielectric and cause the surface of the bottom electrode to oxidize, which results in leakage current problems between the electrode and dielectric. Oxidation of tungsten electrodes also produces oxides that are volatile and lead to adhesion problems.

Current solutions for polysilicon and silicon nitride electrodes require depositing a dielectric thickness of 10 nm or less and annealing the dielectric at a temperature greater than 600° C. However, oxidation of polysilicon and silicon nitride electrodes produce capacitors having low dielectric constants, and the solutions for polysilicon and silicon nitride bottom electrodes are not instructive for the above-described problems associated with tungsten bottom electrodes.

SUMMARY OF THE INVENTION

The present invention is directed to a method of forming a capacitor having a tungsten bottom electrode in a semiconductor wafer that eliminates the effects of oxidation of the surface of the bottom electrode on capacitor performance. The capacitor is included within the metal layer of a conventional integrated circuit to minimize changes to the process flow.

The present invention is directed to a method of forming a capacitor in a semiconductor wafer having a plurality of stacked layers including a substrate, a first dielectric layer including a via that extends through the first dielectric layer and contacts the substrate. The semiconductor wafer also includes a second dielectric layer having a tungsten plug that extends through the second dielectric and contacts the via and that forms a bottom electrode of the capacitor. The method of the present invention comprises a first step of removing a part of the second substrate around the plug to expose a surface thereof. The exposed surface of the plug is then nitridized to form Tungsten Nitride (WN) or Titanium Nitride (TiN) and a capacitor dielectric is formed from a metal oxide material deposited over the nitridized surface of the plug. Alternatively, a metal-nitride is deposited over the tungsten plug to form the bottom capacitor plate. The capacitor dielectric is then annealed and a top electrode of the capacitor is formed over the capacitor dielectric.

The present invention is also directed to an integrated circuit formed on a semiconductor wafer in accordance with the above-described method.

The present invention is further directed to a method of forming a capacitor in a semiconductor wafer having a plurality of stacked layers including a substrate, a first dielectric layer including a via that extends through the first dielectric layer and contacts the substrate. The semiconductor wafer and includes a second dielectric layer having a tungsten plug that extends through the second dielectric and contacts the via and that forms a bottom electrode of the capacitor. The method of the present invention comprises a first step of removing part of the second dielectric layer to expose the tungsten plug. A metal-nitride material is then deposited in blanket fashion over the first dielectric layer left exposed by the removal of the part of the second dielectric layer, including over the exposed tungsten plug. The metal-nitride material is then patterned so that only the tungsten plug remains covered. A capacitor dielectric is then formed by depositing a metal oxide material over the metal-nitride covered tungsten plug, and the capacitor dielectric is annealed. A top electrode of the capacitor is then formed over the capacitor dielectric.

Other objects and features of the present invention will become apparent from the following detailed description, considered in conjunction with the accompanying drawing figures. It is to be understood, however, that the drawings, which are not to scale, are designed solely for the purpose of illustration and not as a definition of the limits of the invention, for which reference should be made to the appended claims.

BRIEF DESCRIPTION OF THE DRAWINGS

In the drawing figures, which are not to scale, and which are merely illustrative, and wherein like reference characters denote similar elements throughout the several views.

DETAILED DESCRIPTION OF THE PRESENTLY PREFERRED EMBODIMENTS

The present invention is directed to a method of forming a capacitor having a tungsten bottom electrode in a semiconductor wafer that eliminates the effects of oxidation of the surface of the bottom electrode on capacitor performance.

Figure 1:
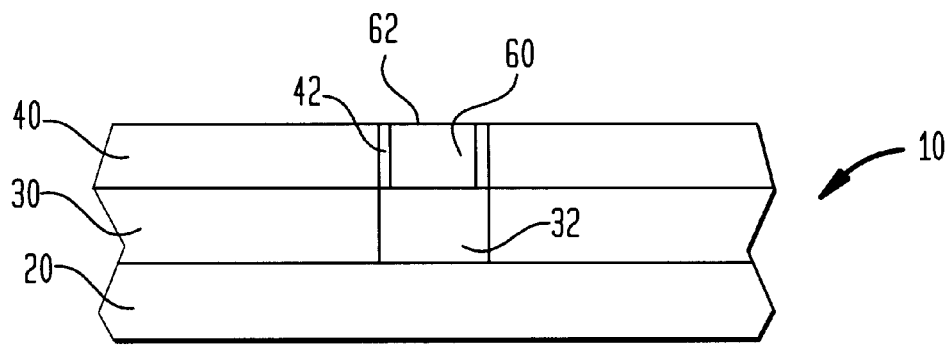
FIG. 1 is a cross-sectional side view of a semiconductor wafer having a tungsten plug formed in a dielectric layer of a semiconductor wafer.
Figure 2:
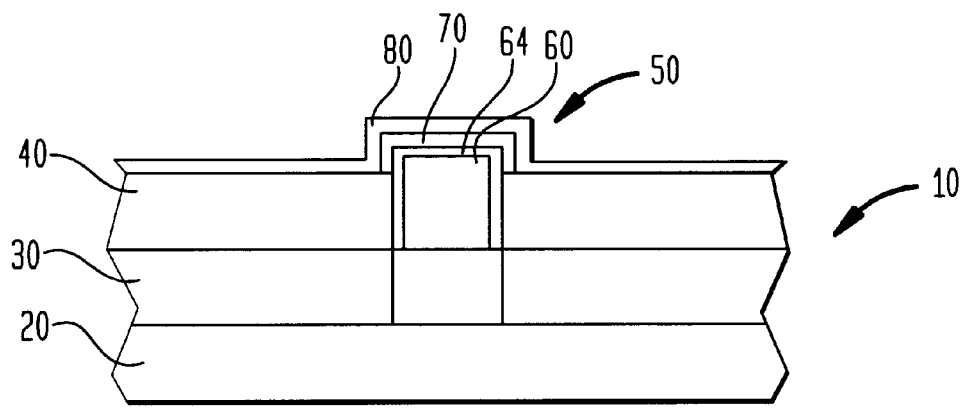
FIG. 2 is capacitor including a tungsten bottom electrode formed in accordance with the present invention.

Referring now to FIGS. 1 and 2 in detail, the capacitor 50 is formed in a semiconductor wafer 10 that has been partially processed according to methods standard to an integrated circuit and that includes a silicon substrate 20 and a first dielectric layer 30 disposed adjacent thereto. The first dielectric layer 30 may comprise silicon-dioxide, or other know dielectric material and includes a via 32 defined therethrough to provide an electrical path through the first dielectric layer 30 to the substrate 20. The wafer 10 further includes a second dielectric layer 40 disposed adjacent and on top of the first dielectric layer 30, and which may also be formed of silicon dioxide or other known dielectric material.

A tungsten plug or via 60 is formed in the second dielectric layer 40 by chemical vapor deposition (CVD). The plug 60 will form the bottom electrode of the capacitor 50 constructed in accordance with the present invention. To facilitate growth of tungsten in the formation of the tungsten plug 60, a seed material such as, for example, titanium nitride and titanium, is first deposited in blanket fashion in a via defined through the second dielectric layer 40. Tungsten is then grown in the via of the second dielectric 40 to fill the tungsten via 60. Chemical mechanical polishing then removes the tungsten from the dielectric and leaves a tungsten filled plug.

To form a capacitor 50 in accordance with the present invention, part of the second dielectric layer 40 is removed to expose a part of the tungsten plug 60. However, the vertical sides of the exposed part of the plug 60 are covered with a layer 42 of titanium/titanium-nitride from the seed material. To provide a uniform, non-oxidizing surface on the outer surface of the exposed part of the plug 60 (i.e., to form a corrosion barrier over the exposed surface of the tungsten plug to prevent oxidation of the titanium nitride layer 42 during formation of the capacitor dielectric), the exposed part of the plug 60 is subjected to a blanket nitridization process which forms a substantially uniform nitridized surface 64 on the exposed part of the tungsten plug 60. The nitridization process may be either by plasma treatment or by rapid thermal treatment. Plasma treating the exposed part of the tungsten plug 60 includes providing a plasma of a gas that includes nitrogen, preferably $NH_3$ or $N_2$. The plasma treatment is performed, for a time period in the range of approximately 10 seconds to 120 seconds, at a pressure in the range of approximately 0.1 Torr to 10 Torr, and at a temperature in the range of approximately 200° C. to 500° C.

When nitridizing using a rapid thermal anneal treatment, the exposed part of the tungsten plug 60 is exposed to a nitrogen containing gas, preferably $NH_3$ or $N_2O$, and subjected to a temperature of approximately less than or equal to 700° C. for a period of approximately less than or equal to 60 seconds.

Once the exposed part of the tungsten plug 60 has been nitridized, the entire exposed surface of the plug 60 comprises a uniform, nitridized (i.e., non-oxidizing) surface of TiN and WN 64. A capacitor dielectric 70 may then be formed on the exposed, nitridized part of the tungsten plug 60 (i.e., on or over the exposed part of the capacitor bottom electrode), preferably by chemical vapor deposition of a layer TaO, TiO, ZrO, BaSrTiO or BaStTi and having a thickness of approximately 100 Å. The capacitor dielectric 70 is then annealed using a plasma generated gas of oxygen and/or nitrogen by thermal treatment, and an upper electrode 80 is formed of tungsten, TiN, TaN, or other transition metal.

Figure 3:
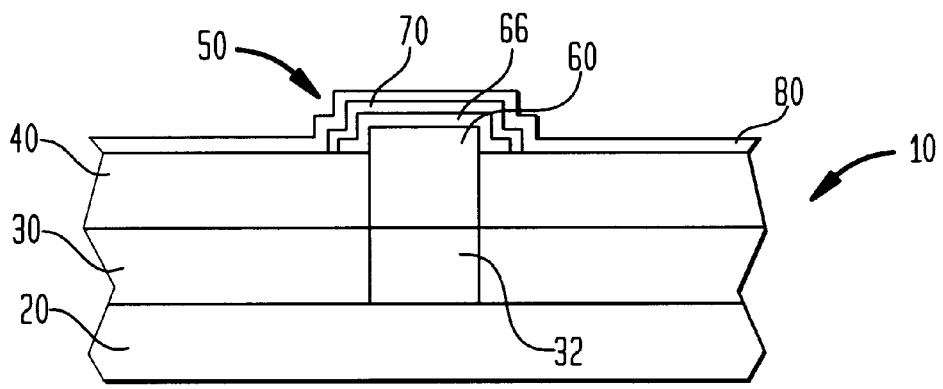
FIG. 3 is a capacitor including a tungsten bottom contact with a deposited metal-nitride as the lower electrode.

In an alternative embodiment, depicted in FIG. 3, part of the second dielectric layer 40 is removed to expose the tungsten plug 60. A metal-nitride material 66 such as, for example, TiN, TaN, WN, is deposited in generally blanket fashion over the remaining part of the second dielectric layer 40. The metal-nitride material 66 is then patterned or etched so that only the tungsten plug 60 remains covered by the metal-nitride material 66. A capacitor dielectric 70 is then formed on the metal-nitride material 66, preferably by chemical vapor deposition, of a layer of TaO, TiO, ZrO, BaSrTiO or BaStTi and having a thickness of approximately 100 Å. The capacitor dielectric 70 is then annealed using a plasma generated gas of oxygen and/or nitrogen by thermal treatment, and an upper electrode 80 is formed of tungsten, TiN, TaN, or other transition metal.

Capacitors constructed in accordance with the present invention may be used in virtually any integrated circuit including, but not limited to, a central processing unit (CPU), digital signal processor, a memory device including SRAM and DRAM devices, an ASIC, and any other electronic device requiring a capacitor. The present invention is thus not limited to the specific examples of integrated circuits and electronic devices described herein, which are provided merely as illustrative, non-limiting examples.

Thus, while there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto.

What is claimed is:

1. A method of forming a capacitor in a semiconductor wafer having a plurality of stacked layers including a substrate, a first dielectric layer including a via that extends through the first dielectric layer and contacts the substrate, and a second dielectric layer including a tungsten plug that extends through the second dielectric and contacts the via and that forms a bottom electrode of the capacitor, said method comprising the steps of:

(a) removing a part of the second dielectric layer to expose a vertical surface of the tungsten plug;

(b) forming a corrosion barrier over the exposed vertical surface of the tungsten plug;

(c) forming a capacitor dielectric by depositing a metal oxide material over the tungsten plug;

(d) annealing the capacitor dielectric; and (d) forming a top electrode of the capacitor over the capacitor dielectric.

2. A method as recited by claim 1, wherein said step (b) comprises exposing the exposed vertical surface of the tungsten plug to a plasma of nitrogen containing gas.

3. A method as recited by claim 2, wherein the nitrogen containing gas is $NH_3$.

4. A method as recited by claim 2, wherein the nitrogen containing gas is $N_2$.

5. A method as recited by claim 2, wherein the nitrogen containing gas is $N_2O$ and wherein said step (d) comprises annealing the capacitor in a plasma generated gas of oxygen and/or nitrogen.

6. A method as recited by claim 1, wherein said step (b) comprises exposing the exposed vertical surface of the tungsten plug to a rapid thermal treatment in a nitrogen containing gas.

7. A method as recited by claim 6, wherein said step (b) comprises exposing the exposed vertical surface of the tungsten plug to a rapid thermal treatment at a temperature of approximately less than or equal to 500° C. and for a time period of approximately less than or equal to 60 seconds.

8. A method as recited by claim 6, wherein the nitrogen containing gas is $NH_3$.

9. A method as recited by claim 6, wherein the nitrogen containing gas is $N_2O$.

10. A method as recited by claim 1, wherein said step (c) comprises forming a capacitor dielectric from a metal oxide material selected from a group of metal oxide materials including TaO, TiO, ZrO, BaSrTiO and BaStTi.

11. A method of forming a capacitor in a semiconductor wafer having a plurality of stacked layers including a substrate, a first dielectric layer including a via that extends through the first dielectric layer and contacts the substrate, and a second dielectric layer including a tungsten plug that extends through the second dielectric and contacts the via and that forms a bottom electrode of the capacitor, said method comprising the steps of:

(a) removing a part of the second dielectric layer to expose a vertical surface of the tungsten plug;

(b) depositing a metal-nitride in blanket fashion, including on the exposed vertical surface of the tungsten plug;

(c) patterning the deposited metal-nitride so that it only covers the tungsten plug;

(d) forming a capacitor dielectric by depositing a metal oxide material over the metal-nitride covered tungsten plug;

(e) annealing the capacitor dielectric; and (f) forming a top electrode of the capacitor over the capacitor dielectric.

12. A method as recited by claim 11, wherein said step (b) comprises depositing a metal-nitride selected from a group of metal-nitrides consisting of TiN, TaN, and WN.

* * * * *